(12) United States Patent
Lin

(10) Patent No.: US 9,240,730 B2
(45) Date of Patent: Jan. 19, 2016

(54) POWER CIRCUIT OF AN AC POWER SUPPLY WITH AN ADJUSTABLE DC VOLTAGE REGULATION CIRCUIT

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 14/736,674

(22) Filed: Jun. 11, 2015

(65) Prior Publication Data

US 2015/0280600 A1 Oct. 1, 2015

Related U.S. Application Data

(63) Continuation-in-part of application No. 13/744,713, filed on Jan. 18, 2013, now abandoned.

(51) Int. Cl.
*H02M 5/42* (2006.01)
*H02M 5/458* (2006.01)
*H02M 1/00* (2007.01)

(52) U.S. Cl.
CPC ............... *H02M 5/42* (2013.01); *H02M 5/458* (2013.01); *H02M 2001/007* (2013.01)

(58) Field of Classification Search
CPC ....... H02M 1/4208; H02M 5/42; H02M 7/48; H02M 2001/007
See application file for complete search history.

(56) References Cited

U.S. PATENT DOCUMENTS

| | | | | | |
|---|---|---|---|---|---|
| 3,408,584 | A | * | 10/1968 | Miller, Jr. | H03F 3/387 330/10 |
| 3,413,446 | A | * | 11/1968 | Rogers | G05D 23/24 219/413 |
| 3,453,547 | A | * | 7/1969 | Rigsbee | H03G 1/02 455/218 |
| 3,764,887 | A | * | 10/1973 | Bingley | G05F 1/30 307/54 |
| 3,824,857 | A | * | 7/1974 | Smith | G01K 13/08 322/100 |
| 4,245,286 | A | * | 1/1981 | Paulkovich | H02M 3/3374 323/906 |
| 4,520,494 | A | * | 5/1985 | Arita | H05G 1/32 378/108 |
| 4,741,010 | A | * | 4/1988 | Hino | H05G 1/32 363/17 |
| 5,068,618 | A | * | 11/1991 | Fry | G01D 5/22 324/705 |
| 5,426,363 | A | * | 6/1995 | Akagi | G01V 3/107 324/207.17 |
| 5,548,501 | A | * | 8/1996 | Chen | H02M 3/33576 363/21.05 |
| 5,889,661 | A | * | 3/1999 | Tamura | H02M 5/4585 363/37 |

(Continued)

*Primary Examiner* — Timothy J Dole
*Assistant Examiner* — Yusef Ahmed
(74) *Attorney, Agent, or Firm* — Ming Chow; Sinorica, LLC

(57) ABSTRACT

A power circuit of an AC power supply includes a power input unit connected to a AC/DC converter. The AC/DC converter is connected to a DC/DC circuit, and the DC/DC circuit is further connected to an adjustable DC voltage regulation circuit. The adjustable DC voltage regulation circuit is connected to an amplifier to amplify and convert the DC voltages into the AC voltages, thereby outputting different AC voltages and electric currents under the condition of not switching off the output when adjusting the voltage via cross position, so that a power level is switched promptly and a very low power distortion.

8 Claims, 6 Drawing Sheets

(56) References Cited

U.S. PATENT DOCUMENTS

| | | | | |
|---|---|---|---|---|
| 6,023,153 | A * | 2/2000 | Fink | H02M 1/4208 323/210 |
| 6,028,777 | A * | 2/2000 | Nguyen | H02M 5/458 363/37 |
| 7,564,706 | B1 * | 7/2009 | Herbert | G05F 1/70 323/222 |
| 8,300,438 | B1 * | 10/2012 | Herbert | H02M 1/4216 363/124 |
| 2005/0006367 | A1 * | 1/2005 | Dodge | B23K 9/1006 219/130.1 |
| 2005/0201124 | A1 * | 9/2005 | Lanni | H02M 1/4208 363/16 |
| 2007/0267393 | A1 * | 11/2007 | Dodge | B23K 9/092 219/130.1 |
| 2009/0303703 | A1 * | 12/2009 | Kao | F21S 8/086 362/183 |
| 2010/0195361 | A1 * | 8/2010 | Stem | H02M 7/5387 363/132 |
| 2012/0286750 | A1 * | 11/2012 | Xu | H02M 3/156 323/282 |
| 2014/0204629 | A1 * | 7/2014 | Lin | H02M 5/458 363/34 |
| 2015/0180355 | A1 * | 6/2015 | Freeman | H02M 1/08 363/21.04 |
| 2015/0280600 | A1 * | 10/2015 | Lin | H02M 5/42 363/34 |

* cited by examiner

POWER CIRCUIT OF AN AC POWER SUPPLY WITH AN ADJUSTABLE DC VOLTAGE REGULATION CIRCUIT

The current application is a continuation-in-part of Ser. No. 13/744,713 filed on Jan. 18, 2013.

BACKGROUND OF THE INVENTION

1. Field of the Invention

The present invention relates to a power circuit of an AC power supply.

2. Description of the Related Art

Referring to FIG. 1, a block diagram of a conventional AC power supply circuit is shown. An output procedure generated from a structure of the power circuit is described as follows. A power input unit 1 receives an outer AC voltage. The power input unit 1 is connected to an AC/DC converter 2 and converts the AC voltage provided from the power input unit 1 into a DC voltage via a filter and rectification.

The DC voltage output from the AC/DC converter 2 is converted by a stable power of a primary side circuit 3 and sent to a transformer 4 for being transformed. The transformer 4 includes a set of primary winding 5 and two sets of secondary windings 6. The primary winding 5 is electrically connected to the primary side circuit 3. The voltage transformed by the transformer 4 is output via the secondary windings 6. The secondary windings 6 are respectively connected to a secondary side circuit 7 thereby supplying a full-wave rectified DC voltage. The full-wave rectified DC voltage is respectively amplified by two amplifiers 8 connected to the secondary side circuits 7, and converted into a sinusoidal output AC voltage.

The amplifiers 8 are further connected to a switch circuit 9 thereby controlling contactors of the switch circuit 9 to close the contacts P1, P2, while S1 and S2 are opened, which allows the amplifiers 8 to be connected in parallel. The switch circuit 9 is able to control the connecting sequence and position, so that the contactors of the switch circuit 9 closed the contacts S1, S2, while P1 and P2 are opened, and the amplifiers 8 are connected in series. Therefore, the series and parallel circuits of the output terminal of the amplifier are switched via the contactors of the switch circuit 9 so as to adjust different AC voltages output from the AC power supply.

The AC power supply power circuit attains the purpose of supplying different AC voltages by switching the parallel-series output of the output terminal of the amplifiers. Since the AC power supply power circuit outputs different AC voltages via a plurality of parallel-series connections of the amplifiers, a complicated circuit and an increasing cost are caused. Moreover, the operation of parallel-series connection is switched by contactors but not the stepless adjusting output mode, so the contact connecting sequence of contactors of the switch circuit has to be controlled when switching and outputting different AC voltages for avoiding a short circuit. In this manner, the voltage output needs to be interrupted, which renders the transmitted power level unable to be switched promptly. The most popular industrial application of AC power supply is an AC power source manufactured by Keysight corporation. AC VOLT RANGE Selections can be 150V or 300V range in AC mode and 200V or 400V range in DC mode. The actual range values may be different depending on the configuration. It is noted that the voltage range is coupled with the output relay state. If the output relay is closed, the voltage range cannot be changed.

Referring to FIG. 2, another conventional AC power supply power circuit which substantially has a similar structure to the previous AC power supply power circuit is shown. The improved power circuit is characterized in that the switch circuit 9 is connected to the secondary side circuit 7, and only one amplifier 8 is connected to the switch circuit 9 in this AC power supply power circuit.

An output procedure of the AC power supply power circuit is described as follows. The power input unit 1 receives the AC voltage supplied from the outside. An AC/DC converter 2 converts the AC voltage processed by a filter and rectification into a DC voltage. The voltage is output from a primary side circuit 3 to a transformer 4 for being transformed and becomes a full-wave rectified DC voltage via the secondary side circuits 7. Different DC voltages are output by the switch circuit 9 which switches the parallel-series connection of the secondary side of circuits 7 and transmitted to the amplifier 8 for being amplified and converted into a sinusoidal output AC voltage. In other words, the AC power supply power circuit makes use of the switch circuit 9 switching the parallel-series connection of the power terminal of the amplifier 8 for outputting different AC voltages.

The above AC power supply power circuit may simplify the circuit thereof and omit one of the amplifiers. However, since the switching operation of the parallel circuit and the series circuit of the switch circuit relies on the contactors but not on a stepless adjusting output mode, the switch circuit must be switched when the output is shut off to change the parallel and series connections of the power terminal of the amplifier for the voltage adjustment when the AC power supply switches and outputs different AC voltages. Therefore, the conventional design causes the inconvenient operation of the AC power supply and needs an improvement. A well known such AC power supply has been manufactured by California Instruments. The output of the DC converter is automatically selected for 250 VDC or 500 VDC output depending on whether the low range output (150 Vac) or high range output (300 Vac) is selected. The 250/500 VDC range selection is made by a relay that selects one of two taps on the DC output. The input/output board holds a lot of the large components and provides interconnection between the AC input, the DC-DC board, the AC power board and the output without the use of heavy cables. The output relay and the output current metering circuit are also mounted on this board. The conventional AC power supply circuit always require a relay for outputting the required AC power. The circuit board of these power supply may be programmed to have a fixed voltage range. Relays are required to switch off the circuit while the output power is to be changed. There is a conventional Programmable Precision High Power DC Power Supply which has 13 models of wide voltage range for same output power. An example is shown in below table.

| Sorensen SGI series | | | |
| --- | --- | --- | --- |
| Model | Voltage | Current | Power (kW) |
| SGI 30X501 | 30 | 501 | 15 |
| SGI 40X375 | 40 | 375 | 15 |
| SGI 50X300 | 50 | 300 | 15 |
| SGI 60X250 | 60 | 250 | 15 |
| SGI 80X188 | 80 | 188 | 15.04 |
| SGI 100X150 | 100 | 150 | 15 |
| SGI 160X94 | 160 | 94 | 15.04 |
| SGI 200X75 | 200 | 75 | 15 |
| SGI 250X60 | 250 | 60 | 15 |
| SGI 330X45 | 330 | 45 | 14.85 |
| SGI 400X38 | 400 | 38 | 15.2 |
| SGI 500X30 | 500 | 30 | 15 |
| SGI 600X25 | 600 | 25 | 15 |

Referring to FIG. 3, a schematic view of the outputting power level of the conventional AC power supply in switching is shown. The AC power supply power circuit supplies a low-voltage power by the parallel input of the power terminal of the amplifier. The AC power supply power circuit supplies a high-voltage power by the series input of the power terminal of the amplifier. In low-voltage power supply, the power terminal of the amplifier parallelly inputs the power supply of the low voltage and high electric current. In high-voltage power supply, the power terminal of the amplifier serially inputs the power supply of the high voltage and low electric current. The power level is unable to be switched promptly in switching, that is to say, the voltage stops outputting in switching. Therefore, it may cause a great distorted error while stopping outputting. Hence, the AC power supply power circuit is restricted and has the above-mentioned disadvantages.

In terms of that, the inventor of the present invention holds the spirit of trying for the best with the experiences of devoting to the professional development, manufacture, and marketing of the electronic equipments and the related components, thereby improving the disadvantages of the conventional AC power supply power circuit.

SUMMARY OF THE INVENTION

It is an object of the present invention to provide a power circuit of an AC power supply which supplies different AC voltages and electric currents and constantly outputting the voltages when adjusting the voltages via cross position, so that the power level is able to be switched promptly and a distortion thereof is very low.

Another object of the present invention is to provide a power circuit for an AC power supply with very limited number of models of power range in a fixed output power. For example, a three models of wide range like 0-650V, 0-69 A, 15 kW; 0-250V, 0-180 A, 15 kW and 0-80V, 0-540 A, 15 kW which is much better than 13 models of a conventional power supplies.

The power circuit of an AC power supply in accordance with the present invention comprises a power input unit supplying an AC voltage from the outside. The power input unit is connected to an AC/DC converter and transforms the AC voltage input therefrom into a DC voltage via a filter and rectification. The AC/DC converter is connected to a DC/DC circuit. The DC/DC circuit includes a primary side circuit connected to a transformer. The transformer is connected to a secondary side circuit for transforming a voltage level and becoming a full-wave rectified DC voltage. The secondary side circuit is connected to an adjustable DC voltage regulation circuit for regulating and stabilizing a voltage level of the DC voltage output from the secondary side circuit. The adjustable DC voltage regulation circuit is connected to an amplifier for amplifying and converting the DC voltage output from the adjustable DC voltage regulation circuit into the AC voltage.

The AC power supply power circuit is connected to the adjustable DC voltage regulation circuit via the DC/DC circuit, and further connected to the amplifier so as to simplify the circuit and lower the cost, thereby outputting different AC voltages under the condition of not stopping the power supply and attaining the purpose of constantly outputting when adjusting the voltage. Therefore, the power level is able to be switched promptly and a distortion is very low.

DETAILED DESCRIPTION OF THE PREFERRED EMBODIMENTS

Figure 1:
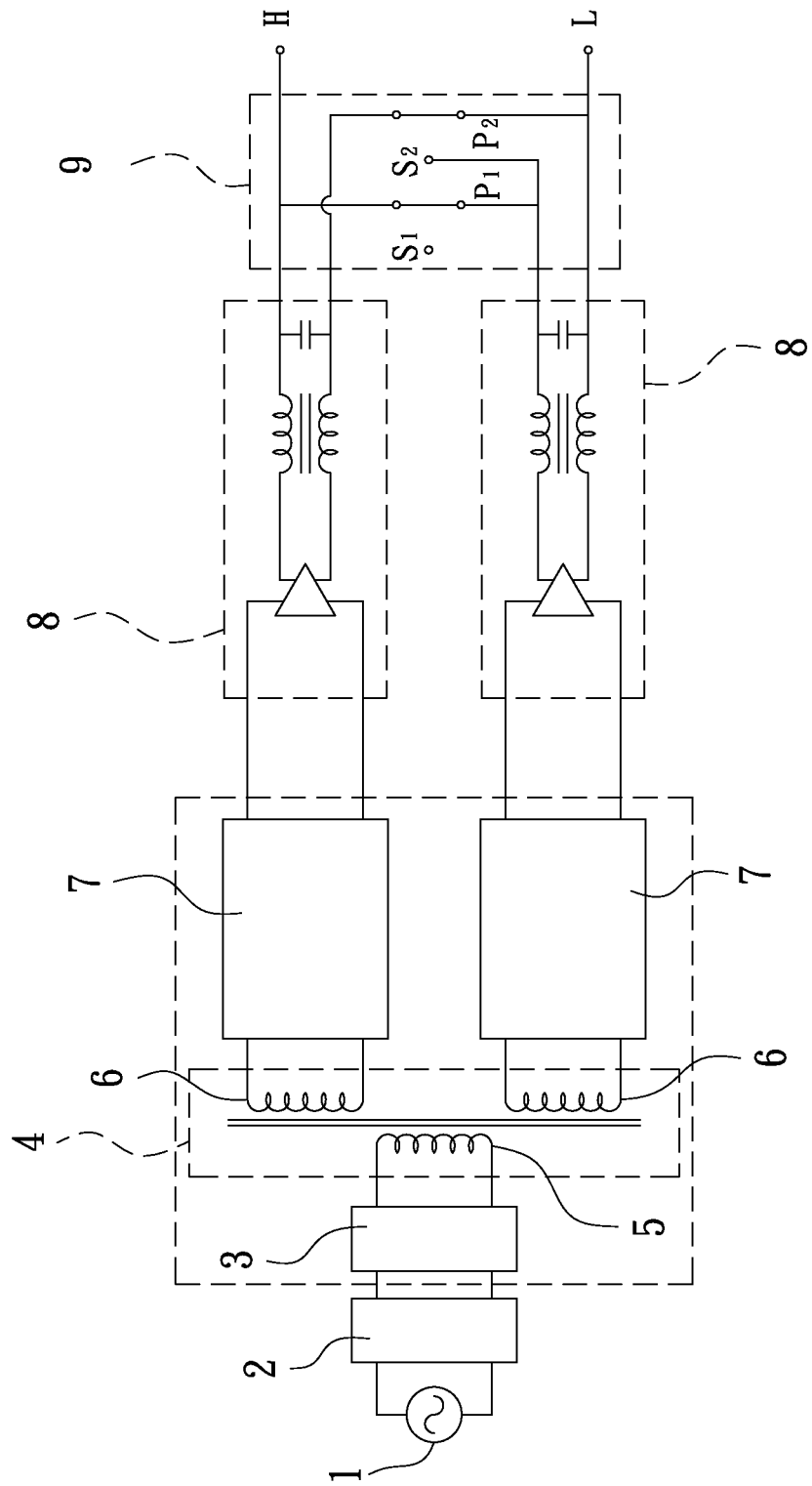
FIG. 1 is a block diagram showing a conventional AC power supply power circuit.
Figure 2:
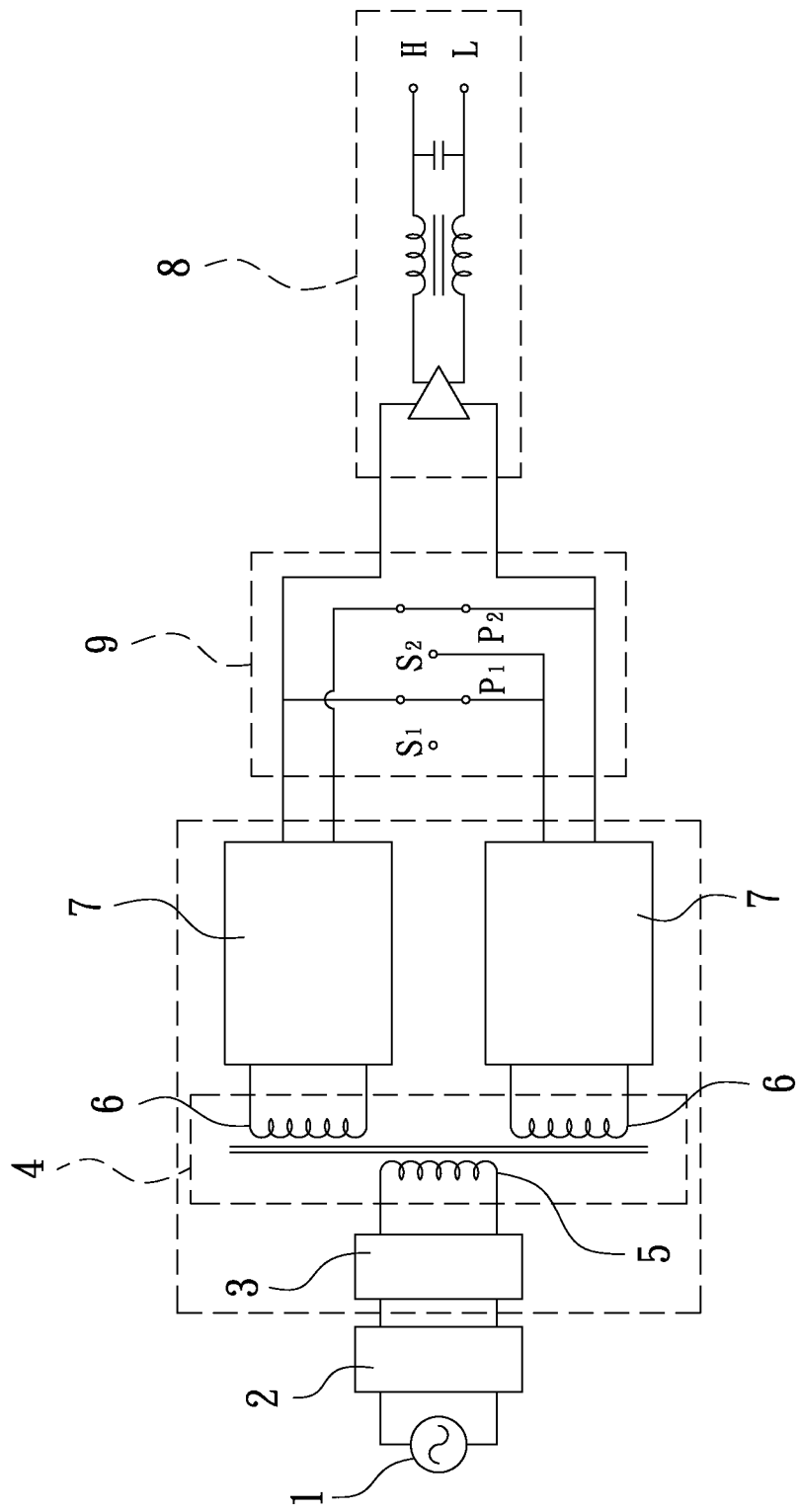
FIG. 2 is a block diagram showing the conventional AC power supply power circuit.
Figure 3:
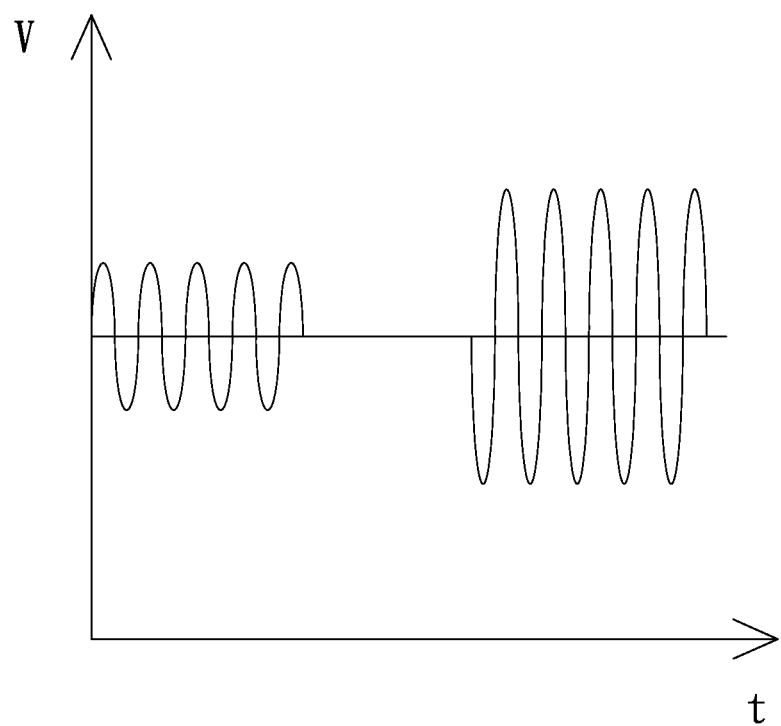
FIG. 3 is a schematic view showing a power level output from the conventional AC power supply power circuit in switching.
Figure 4:
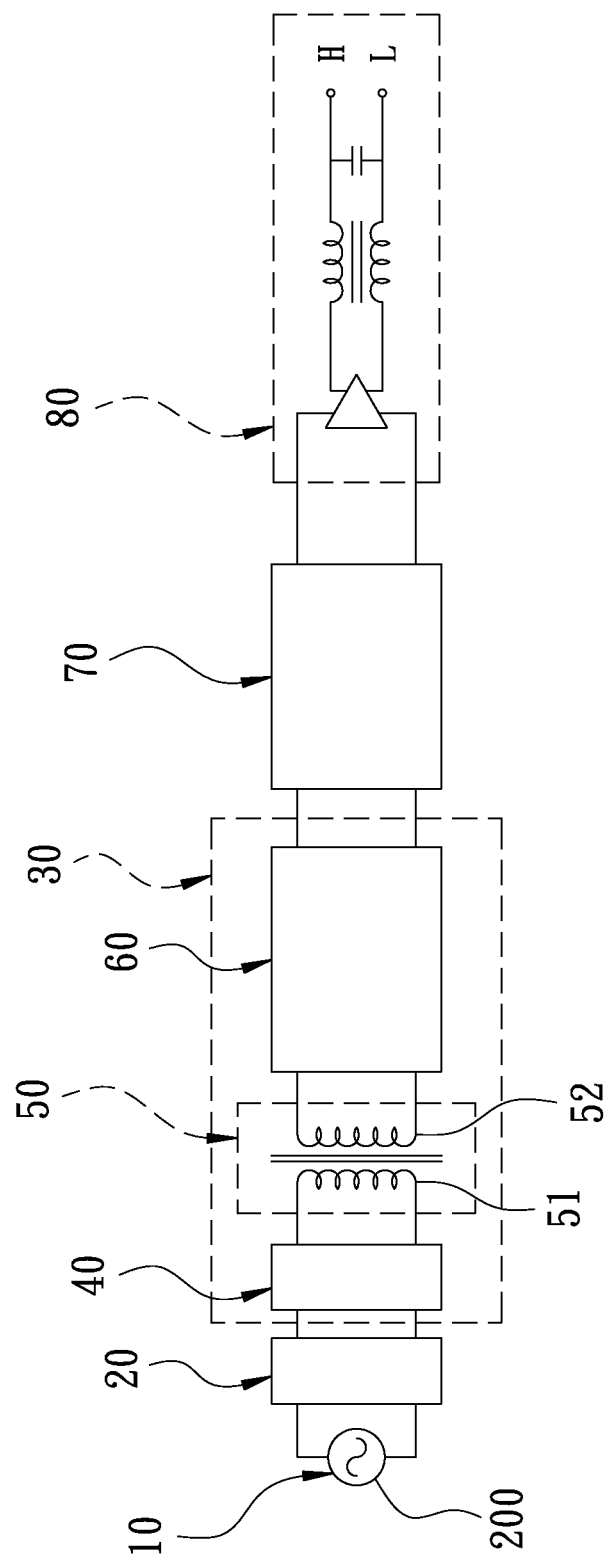
FIG. 4 is a block diagram showing a preferred embodiment of the present invention.

Referring to FIG. 4 which shows a block diagram of a preferred embodiment of the present invention, a power circuit comprises a power input unit 10 externally connected to an AC power 200, thereby supplying an outside AC voltage.

An AC/DC converter 20 connected to the power input unit 10 for receiving the AC voltage supplied from the power input unit 10 and converting the AC voltage input from the power input unit 10 into a DC voltage via a filter and rectification.

A DC/DC circuit 30 connected to the AC/DC converter 20. The DC/DC circuit 30 includes a primary side circuit 40. The primary side circuit 40 is connected to the AC/DC converter 20 and is able to execute a conversion of a stable power of the DC voltage converted by the AC/DC converter 20. The primary side circuit 40 is connected to a transformer 50. The transformer 50 includes a set of primary winding 51 and a set of secondary winding 52. The primary winding 51 is connected to the primary side circuit 40 and receives the voltage output from the primary side circuit 40 for transforming the voltage level of the voltage. The voltage transformed by the transformer 50 is output from the secondary winding 52. The secondary winding 52 is connected to a secondary side circuit 60 for providing a full-wave rectified DC voltage formed by rectifying and filtering the DC voltage which is transformed by the transformer 50 and output via the secondary winding 52.

An adjustable DC voltage regulation circuit 70 defined as an adjustable DC/DC circuit. In this preferred embodiment, the adjustable DC voltage regulation circuit 70 is preferably adopted by a step-down converter but not limited to the embodiment scopes of the present invention. The adjustable DC voltage regulation circuit 70 is connected to the secondary side circuit 60 of the DC/DC circuit 30 for regulating and stabilizing a voltage level of the DC voltage output from the DC/DC circuit 30. Furthermore, the adjustable DC voltage regulation circuit 70 regulates the DC voltage output from the DC/DC 30 into a different voltage level, thereby adjusting to output DC voltages of different voltage levels.

An amplifier 80 connected to the adjustable DC voltage regulation circuit 70, thereby amplifying and transforming the DC voltage output from the adjustable DC voltage regulation circuit 70 into the AC voltage.

Referring to FIG. 4, when the power input unit 10 receives the AC voltage supplied externally, the AC voltage is processed via the filter and rectification and converted into the DC voltage via the AC/DC converter 20, a stable power of which is converted by the primary side circuit 40, output to the primary winding 51, and then transformed via the transformer 50. The transformed voltage is further output by the secondary winding 52, and the secondary side circuit 60 provides a full-wave rectified DC voltage by rectifying and filtering the voltage output from the secondary winding 52. Furthermore, the voltage level of the DC voltage output from the secondary side circuit 60 is stepless-regulated and stabilized by the adjustable DC voltage regulation circuit 70. Since the adjustable DC voltage regulation circuit 70 is a stepless-adjusting voltage level, the circuit thereof does not need to be switched for the disconnection so as to adjust different outputs of the DC voltages under the condition of not switching off the output. The voltage level of the DC voltage is adjusted to be correspond to the DC voltage of the AC voltage that is about to be output from the AC power supply of the present invention. The DC voltage is transmitted to the amplifier 80 for being amplified and converted into the corresponding AC voltage output. In this manner, the AC power supply power circuit of the present invention takes advantages of the adjustable DC voltage regulation circuit 70 which can adjust different outputs of DC voltages under the condition of not switching off the output so that the DC voltages are converted into different AC voltages. The AC power supply of the present invention is allowed to output different AC voltages, which attains the purpose of adjusting the voltages without interrupting the output, switching the power level promptly, and reaching a very low distortion thereof.

Figure 5:
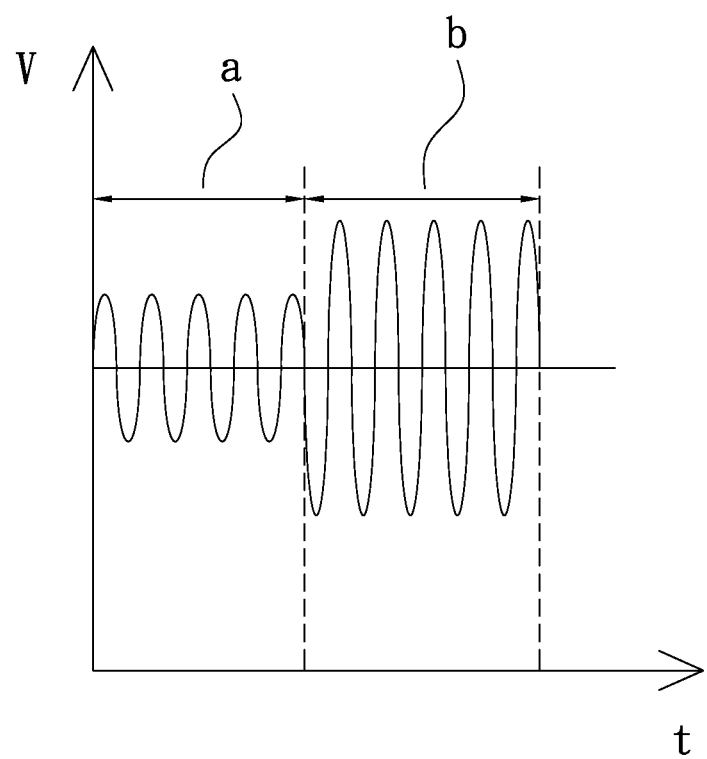
FIG. 5 is a schematic view showing the power level output from the preferred embodiment of the present invention in switching.

Referring to FIG. 5, a schematic view of the power level output from the preferred embodiment of the present invention in switching is shown. When the AC power supply power circuit is in a low-voltage power supply, an AC supply with a low voltage and high electric current a is provided. The AC voltage output from the amplifier is a low-voltage less than 150 volts and is in a low-voltage power supply position through the adjustable DC voltage regulation circuit, thereby supplying a DC voltage corresponding to the AC voltage converted and output from the amplifier. When the AC power supply power circuit is in a high-voltage power supply, an AC supply with a high voltage and low electric current b is provided. The AC voltage output from the amplifier is a high-voltage over 150 volts and is in a high-voltage power supply position through the adjustable DC voltage regulation circuit, thereby supplying a DC voltage corresponding to the AC voltage converted and output from the amplifier. Since the circuit does not need to be switched for the disconnection, the different DC voltage outputs are able to be adjusted under the condition of not switching off, so that the power level output from the AC power supply power circuit of the present invention can be switched continuously and promptly.

Another state of the adjustable DC voltage regulation circuit of the present invention is a dynamic regulation according to which proceeds an instant supply voltage regulation of the adjustable DC regulation circuit in light of an efficiency of converting the DC voltage output from the adjustable DC voltage into an AC voltage according to different voltage levels of the AC voltage output from the amplifier. A schematic view of the power level output from this practice in switching is shown as FIG. 5. The different DC voltage outputs may be adjusted under the condition without switching the connectors, so that the power level output from the AC power supply is able to be switched continuously and promptly.

Figure 6:
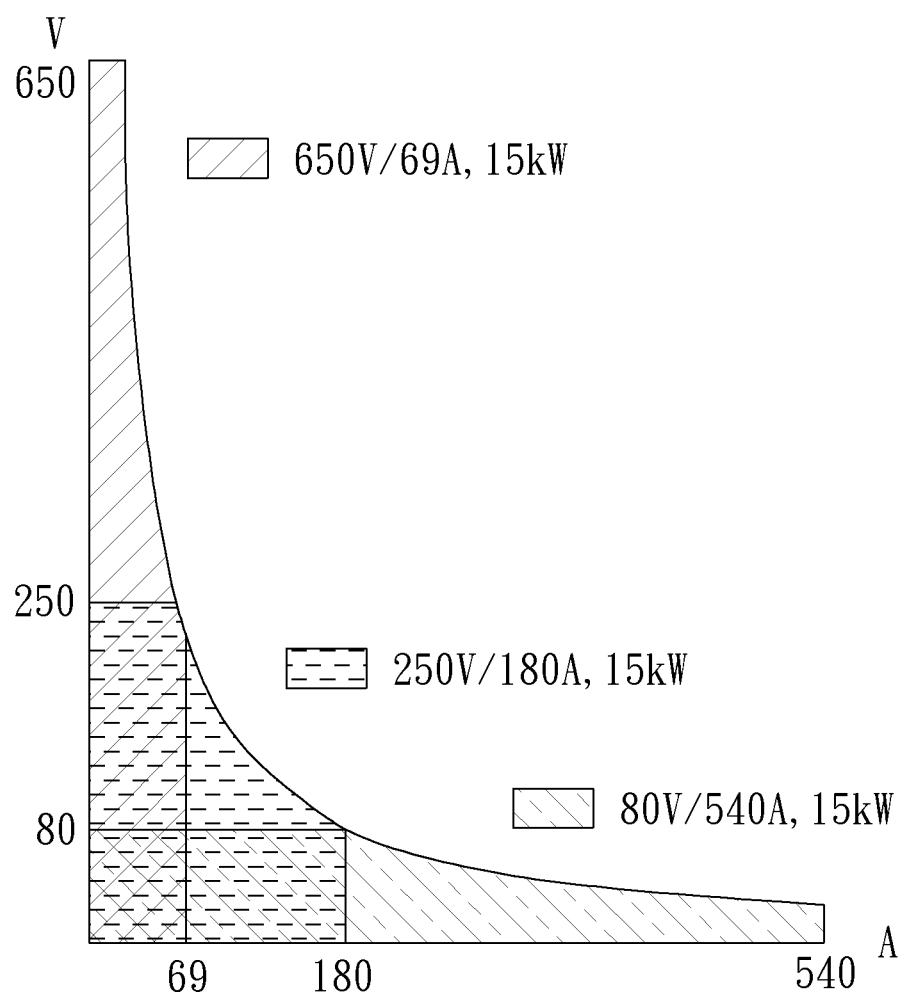
FIG. 6 is a diagram showing a three models of wide range voltage and current control to be adopted in the power circuit of an AC power supply according to the present invention.

Referring to FIG. 6 which a diagram showing a three models of wide range voltage and current control to be adopted in the power circuit of an AC power supply according to the present invention, it is readily understood that with an out put of 15 KW, there can be three models of wide range output AC voltage control such as 0-650V, 0-69 A, 15 kW; 0-250V, 0-180 A, 15 kW and 0-80V, 0-540 A, 15 kW which is much better than 13 models of a conventional power supplies.

The AC power supply power circuit of the present invention makes use of the DC/DC circuit to be connected to the adjustable DC voltage regulation circuit and the amplifier. Therefore, comparing with the conventional AC power supply power circuit, the AC power supply power circuit of the present invention omits a DC/DC circuit and an amplifier for simplifying the circuit, avoiding the ripple current and decreasing the distortion.

Although the present invention has been described in a way of preferred embodiment, however, other changes and modifications can still be made without departing from the spirit of the invention and shall be fallen in the scope of the appended Claims.

What is claimed is:

1. A power circuit of an AC power supply comprising:
   a power input unit externally connected to an AC power, thereby supplying an AC voltage from an outside;
   an AC/DC converter connected to said power input unit for converting said AC voltage input from said power input unit into a DC voltage output via a filter and rectification;
   an DC/DC circuit connected to said AC/DC converter for providing a full-wave rectified DC voltage which is formed by transforming a voltage level of said DC voltage output from said AC/DC converter;
   an adjustable DC voltage regulation circuit connected to said DC/DC circuit for regulating and stabilizing said voltage level of said DC voltage output from said DC/DC circuit;
   an amplifier connected to said adjustable DC voltage regulation circuit for amplifying and converting said DC voltage output from said adjustable DC voltage regulation circuit into an AC voltage; said adjustable DC voltage regulation circuit being a step-down converter;
   a primary side circuit connected to a transformer; said transformer is further connected to a secondary side circuit; said adjustable DC voltage regulation circuit adjusting different outputs of DC voltages under a condition of not switching off to allow DC voltages to be converted into different AC voltage; said AC power supply power circuit outputting different AC voltages; and said AC power supply power circuit adjusting voltages via cross position without interrupting output, switching a power level promptly, and reaching a very low distortion thereof; and
   said adjustable DC voltage regulation circuit is a constant voltage regulation; when said AC voltage output from said amplifier is a high-voltage over 150 volts, said adjustable DC voltage regulation circuit is in a position of high-voltage power supply; when said AC voltage output from said amplifier is a low-voltage less than 150 volts, said adjustable DC voltage regulation circuit is in a position of low-voltage power supply.

2. A power circuit of an AC power supply as claimed in claim 1, wherein said primary side circuit is connected to said AC/DC converter.

3. A power circuit of an AC power supply as claimed in claim 1, wherein said transformer includes a set of primary winding and a set of secondary winding; said primary winding is connected to said primary side circuit, and a voltage transformed by said transformer is output via said secondary winding.

4. A power circuit of an AC power supply as claimed in claim 3, wherein said secondary side circuit is connected to said secondary winding for providing a full-wave rectified DC voltage formed by rectifying and filtering said voltage which is transformed by said transformer and output via said secondary winding.

5. A power circuit of an AC power supply comprising:
a power input unit externally connected to an AC power, thereby supplying an AC voltage from an outside;
an AC/DC converter connected to said power input unit for converting said AC voltage input from said power input unit into a DC voltage output via a filter and rectification;
an DC/DC circuit connected to said AC/DC converter for providing a full-wave rectified DC voltage which is formed by transforming a voltage level of said DC voltage output from said AC/DC converter;
an adjustable DC voltage regulation circuit connected to said DC/DC circuit for regulating and stabilizing said voltage level of said DC voltage output from said DC/DC circuit;
an amplifier connected to said adjustable DC voltage regulation circuit for amplifying and converting said DC voltage output from said adjustable DC voltage regulation circuit into an AC voltage; said adjustable DC voltage regulation circuit being a step-down converter;
a primary side circuit connected to a transformer; said transformer is further connected to a secondary side circuit; said adjustable DC voltage regulation circuit adjusting different outputs of DC voltages under a condition of not switching off to allow DC voltages to be converted into different AC voltage; said AC power supply power circuit outputting different AC voltages; and said AC power supply power circuit adjusting voltages via cross position without interrupting output, switching a power level promptly, and reaching a very low distortion thereof; and
said adjustable DC voltage regulation circuit is a dynamic voltage regulation according to which proceeds an instant supply voltage regulation of said adjustable DC regulation circuit in light of an efficiency of converting said DC voltage output from said adjustable DC voltage into an AC voltage according to different voltage levels of said AC voltage output from said amplifier.

6. A power circuit of an AC power supply as claimed in claim 5, wherein said primary side circuit is connected to said AC/DC converter.

7. A power circuit of an AC power supply as claimed in claim 5, wherein said transformer includes a set of primary winding and a set of secondary winding; said primary winding is connected to said primary side circuit, and a voltage transformed by said transformer is output via said secondary winding.

8. A power circuit of an AC power supply as claimed in claim 7, wherein said secondary side circuit is connected to said secondary winding for providing a full-wave rectified DC voltage formed by rectifying and filtering said voltage which is transformed by said transformer and output via said secondary winding.

* * * * *